United States Patent
Phelan et al.

(10) Patent No.: US 9,233,438 B2
(45) Date of Patent: Jan. 12, 2016

(54) HEAT SINK AND METHOD FOR MANUFACTURING

(75) Inventors: Matthew Phelan, Clackamas, OR (US); Michael Tozier, Portland, OR (US); Jonas Bjuhr, Nassjo (SE); David Litter, Shanghai (CN); Chunming Chen, Salt Lake City, UT (US)

(73) Assignee: SAPA AB, Stockholm (SE)

( * ) Notice: Subject to any disclaimer, the term of this patent is extended or adjusted under 35 U.S.C. 154(b) by 853 days.

(21) Appl. No.: 13/465,431

(22) Filed: May 7, 2012

(65) Prior Publication Data

US 2013/0175019 A1     Jul. 11, 2013

Related U.S. Application Data

(63) Continuation of application No. PCT/CN2012/070063, filed on Jan. 5, 2012.

(51) Int. Cl.
*B23P 15/26*     (2006.01)
*H01L 23/367*     (2006.01)
(Continued)

(52) U.S. Cl.
CPC ............... *B23P 15/26* (2013.01); *B23K 20/122* (2013.01); *B23K 20/129* (2013.01);
(Continued)

(58) Field of Classification Search
CPC ............... B23K 20/122; B23K 20/129; B23K 2201/14; B23K 2203/10; B23P 15/26; B23P 2700/00; F28D 15/0275; F28F 3/02; F28F 2275/14; F28F 38/00; F28F 3/04; F28F 2275/205; H01L 21/4882; H01L 23/3672; H01L 2924/0002; H01L 2924/00; Y10T 29/49353; Y10T 29/49366; Y10T 29/4935
See application file for complete search history.

(56) References Cited

U.S. PATENT DOCUMENTS 6,321,452 B1 * 11/2001 Lin ......................... 29/890.032
6,637,109 B2    10/2003 Nyqvist
(Continued)

FOREIGN PATENT DOCUMENTS

CN     1503989 A     6/2004
CN     1557116 A     12/2004
(Continued)

OTHER PUBLICATIONS

International Search Report issued Oct. 18, 2012 in International Patent Application No. PCT/CN2012/070063.
(Continued)

*Primary Examiner* — Alexander P Taousakis
(74) *Attorney, Agent, or Firm* — Venable LLP; Steven J. Schwarz; Michael A. Sartori

(57) ABSTRACT

The present application relates to a method of manufacturing a heat sink from a plurality of extruded lamellas, each lamella including a base portion having a top surface, a bottom surface, and two side surfaces, each lamella further including a fin portion extending from the top surface of the base portion, wherein the base portion is wider than the fin portion. The method includes aligning the base portions of the plurality of lamellas with the fin portion of each lamella extending in the same direction and the side surfaces of adjacent base portions facing each other; pressing the base portions of adjacent lamellas into contact with each other by applying a force to the side surface of at least one of the base portions; and welding the bottom surfaces of adjacent base portions together. A heat sink and a lamella for use in manufacturing a heat sink are also disclosed.

5 Claims, 12 Drawing Sheets

(51) Int. Cl.
*F28F 3/00* (2006.01)
*H01L 23/427* (2006.01)
*H01L 21/48* (2006.01)
*F28F 3/02* (2006.01)
*F28D 15/02* (2006.01)
*B23K 20/12* (2006.01)

(52) U.S. Cl.
CPC ............ *F28D 15/0275* (2013.01); *F28F 3/02* (2013.01); *H01L 21/4882* (2013.01); *H01L 23/3672* (2013.01); *H01L 23/427* (2013.01); *B23K 2201/14* (2013.01); *B23K 2203/10* (2013.01); *B23P 2700/10* (2013.01); *F28F 2275/14* (2013.01); *H01L 2924/0002* (2013.01); *Y10T 29/49353* (2015.01); *Y10T 29/49366* (2015.01)

(56) References Cited

U.S. PATENT DOCUMENTS

| | | | |
|---|---|---|---|
| 7,762,315 B2* | 7/2010 | Shen | 165/80.3 |
| 8,966,758 B1* | 3/2015 | McReynolds | 29/890.03 |
| 2003/0056368 A1* | 3/2003 | Nyqvist | 29/890.03 |
| 2004/0182542 A1 | 9/2004 | Take et al. | |
| 2009/0178782 A1* | 7/2009 | Guyon et al. | 165/80.3 |
| 2010/0181047 A1* | 7/2010 | Lin et al. | 165/104.26 |
| 2012/0014067 A1* | 1/2012 | Siracki | 361/709 |
| 2012/0138273 A1* | 6/2012 | Lin | 165/104.26 |
| 2012/0192574 A1* | 8/2012 | Ghoshal et al. | 62/3.2 |
| 2013/0000872 A1* | 1/2013 | Lin | 165/104.26 |
| 2013/0322019 A1* | 12/2013 | Gasse et al. | 361/709 |
| 2014/0318757 A1* | 10/2014 | Yan et al. | 165/185 |
| 2015/0062819 A1* | 3/2015 | Oughton et al. | 361/700 |
| 2015/0096720 A1* | 4/2015 | Lin et al. | 165/104.21 |

FOREIGN PATENT DOCUMENTS

| | | |
|---|---|---|
| CN | 101405561 A | 4/2009 |
| CN | 101947691 A | 1/2011 |
| CN | 102231370 A | 11/2011 |
| DE | 10031689 B4 | 5/2004 |
| JP | 2000-150738 A | 5/2000 |
| JP | 2001-293530 A | 10/2001 |
| JP | 2002-263863 A | 9/2002 |
| JP | 2003-101277 A | 4/2003 |
| JP | 2003-290936 A | 10/2003 |
| JP | 2004-319670 A | 11/2004 |
| JP | 3740125 B2 | 2/2006 |
| JP | 2006-075893 A | 3/2006 |
| JP | 2007-307579 A | 11/2007 |
| JP | 2008235842 A | 10/2008 |
| JP | 4467895 B2 | 5/2010 |
| PL | 390268 A1 | 8/2011 |
| WO | WO-02/089206 A1 | 11/2002 |

OTHER PUBLICATIONS

Written Opinion issued on Oct. 18, 2012 in International Patent Application No. PCT/CN2012/070063.
Notification of First Office Action and translation issued Sep. 8, 2015 in Chinese Patent Application No. 201280030327.2.
Chinese Search Report and translation issued Aug. 26, 2015 in Chinese Patent Application No. 201280030327.2.

* cited by examiner

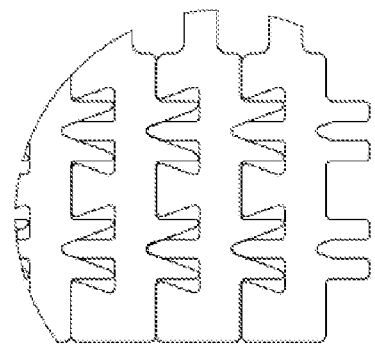 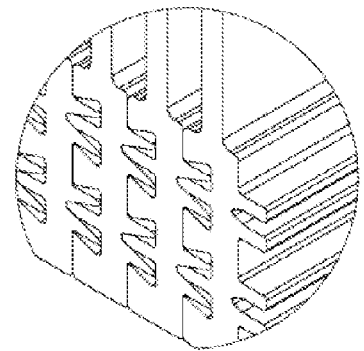
Fig. 8　　　　　　Fig. 9
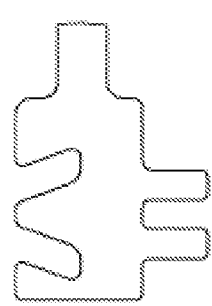 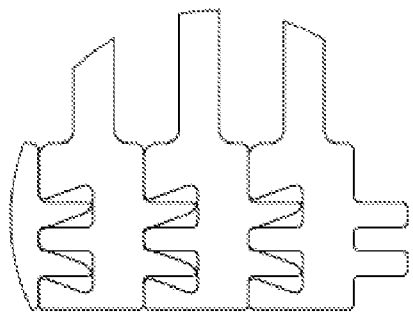
Fig. 10　　　　　　Fig. 11
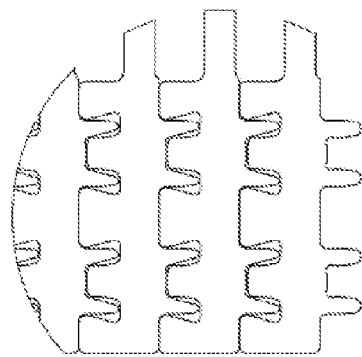
Fig. 12

HEAT SINK AND METHOD FOR MANUFACTURING

CROSS-REFERENCE TO RELATED APPLICATIONS

The present application is a continuation of International Application No. PCT/CN2012/070063, filed in China on Jan. 5, 2012, the entire contents of which are expressly incorporated herein by reference.

FIELD OF THE INVENTION

The subject matter of the application relates to heat sinks, electronic packages including the heat sinks, methods for forming heat sinks, and electronic packages.

BACKGROUND OF THE INVENTION

In order to cool the temperature of electronic components, aluminum heat sinks are often used. Aluminum and/or aluminum alloys are often utilized to form heat sinks due to their high thermal performance characteristics, ability to be extruded and availability in the marketplace. A cost efficient way of manufacturing an aluminum heat sink is extruding the metal in a fin and base configuration as shown in FIGS. 1a-1d.

In the embodiment shown in FIG. 1 and disclosed in U.S. Pat. No. 6,637,109 B2, the heat sink has base portions 15 and 17 that act as a mounting surface for the heat generating components, and the fins therebetween form a fin portion which adds a surface area, which is critical for maximizing heat dissipation from attached heat-generating components. Heat that is generated by the components is initially transferred through conduction to the base portions 15 and 17 (top and bottom portions) of the heat sink and subsequently into the fins where the heat is dissipated to the surroundings via radiation, forced convection, and/or natural convection. Because there is a direct correlation between the amount of surface area and total heat transfer, it is advantageous to maximize fin height and density, which minimizes the gap/space therein between fins, particularly when dealing with forced convection applications.

Aspect ratio is a relationship for characterizing heat sinks, where the ratio is mathematically defined as fin height divided by the gap between fins. Current extrusion technology limits the ratios achievable because as the aspect ratio increases, the extrusion die becomes weaker when extruding such heat sinks as a one-piece profile. To decrease the probability of die failure, the extrusion process speed is usually decreased, reducing overall productivity of the extrusion press. Heat sinks with higher ratio fins manufactured as one-piece by the aluminum alloy extrusion method also incur larger scrap rates.

One method of addressing issues related to manufacturing of high-aspect ratio heat sinks from single extruded profiles is joining them together by Friction Stir Welding (FSW) as disclosed in U.S. Pat. No. 6,637,109 B2. The method includes extruding or bending of an extruded profile which is cut in a plurality of pieces of the appropriate length. The single profile cross-section includes a first end portion, a second end portion, and a connecting web portion, where the first and second base portions are thicker than the web portion. The pieces of extruded profiles are then aligned and joined together by friction stir welding along their contacting surfaces. In cases where heat generating components are placed on both the top surface of the base portion 15 and the bottom surface of the base portion 17, this can be a cost effective solution that overcomes the problem of extruding a single piece as noted above.

A drawback of this method is that it cannot be utilized to form a heat sink having a base plate for mounting the element to be cooled on only one side. This problem occurs when such a "one-sided" heat sink with very dense fins is needed. It is not possible to extrude a one-sided heat sink with dense fins as a single-piece unit due to previously mentioned limitations surrounding the aluminum extrusion process.

Thermal performance of heat sinks generally increases as the ratio of fin height to fin gap increases. As a result, bonded heat sinks are used when high heat load dissipation is required. Bonding techniques for making bonded heat sinks include brazing, epoxy bonding, mechanical (press-fit or snap), and friction stir welding. However, while high fin density heat sinks can be made by brazing and epoxy bonding, a filler material has to be used to facilitate the bond, which creates some degree of thermal resistance at the joint, which has a negative effect on overall thermal performance. Additionally, these methods are labor intensive, which causes their manufacturing costs to be quite high. Furthermore, it is known that epoxy joints can weaken over time, reducing the mechanical strength of the bond and inhibiting heat transfer.

Mechanical joining includes making heat sinks from extrusions, profiles, called lamellar, or other segments having a number of fins and interconnected by press and/or snap fitting. However, while this method is cost-efficient, it suffers from a few disadvantages. The disadvantages of mechanical joining include a mediocre bonding strength, which is not suitable for all applications. This can cause reliability issues during exploitation of such a heat sink. Additionally, air gaps can exist around mechanical joints, which can cause high spreading thermal resistance. Furthermore, machining and drilling processes, which are required for heat pipe integration and/or heat generating component attachment, may loosen the adjacent mechanical joints of two neighboring extrusions or profiles.

Friction stir welding has also been utilized as a bonding method to join aligned extrusions or lamellar segments. Friction stir welding for joining parts made of aluminum alloy typically utilizes a non-consumable rotating tool including a shoulder and a pin, which often includes specially configured surfaces for increasing friction when the tool is in contact with the metal. The rotating friction stir welding tool usually also moves linearly along the adjacently aligned edges of two workpieces to be joined together. The friction generated by this rotation heats and plasticizes the material at the weld zone. The plasticized material of two joining adjacent parts is fused together and thus creates a weld seam along their edges. As the tool rotates, a downward force is applied on the workpiece to sufficiently fuse the two pieces together. Deformation might occur when the rotating tool traverses abutting edges of lamellar segments or profiles since there is no support or joint underneath for the one-sided heat sink embodiment to counteract the previously mentioned down force. Therefore, the workpieces usually require a support from the side opposite the welding where the force is applied, a rear or down side, as, for example, is shown in FIG. 1a. Alternatively, the workpieces have a shape allowing the other, down or opposite part of the work piece to serve as a support to compensate for the rather substantial vertical forces applied during friction stir welding. It is known in the art to use friction stir welding for joining of two metal or plastic work pieces.

FSW is the most efficient bonding method providing high tensile strength of the joined parts while maintaining high thermal conductivity at the joint. However, when forming heat sink segments from lamellar or extruded profiles, the segments are typically arranged only by clamping. When the segment is formed by, for example, a press-fit connection, where a neighboring extrusions or profiles have interacting extensions on one side and grooves receiving those extensions on the other side, significant air gaps might exist between lamellar segments in those press-fit connections around extensions spaced within the grooves in non-weld areas, especially for a large scale heat sink. Such gaps can result in high spreading thermal resistance. Additionally, if these air gaps occur in the weld zone, they can create a defective weld that will contain voids. In addition, I-, U-, and S-shaped cross-sections, such as those shown in FIGS. 1b, 1c and 1d, need to include two end portions, which limits the variations of shapes of the final product and increases the weight of the heat sink.

SUMMARY OF THE INVENTION

Embodiments of the invention can permit an increase in the ratio between the thickness of the fin and the thickness/width of the base portion. Thickness of the fin can be drastically reduced by utilizing the individual profiles as compared to the heat sinks extruded as a single unit. Embodiments of the invention can also permit a light construction as compared to known heat sinks with the elimination of a second end portion. Furthermore, embodiments of the invention can permit the thickness of the individual fins to be reduced since the fins do not need to serve as a support and withstand the applied forces during FSW.

According to one aspect of the invention, there is provided a heat sink including a plurality of individual lamellas or profiles manufactured by extrusion, preferably from aluminum or its alloys. Each lamella includes a base portion having a bottom and a fin portion extending from a top of the base portion. The base portion is wider than the fin portion. Alternatively, each base portion can include at its sides at least one extension on a first side and at least one groove on a second side opposite the first side. The at least one groove is configured to receive an extension on an adjacent lamella, for example, to ensure alignment of the base portions, or to provide a snap connection between adjacent base portions.

All of the lamellas for forming a heat sink may be identical. Alternatively, one or more of the lamellas may have a different configuration and/or cross-section. The fins and/or the base portions may have different configurations and/or cross-sections. The fins could have different ratios between the thickness of the fin and width of the base portion. In some cases, the heat sink comprises the fins, where none of the fins are of the same dimensions and cross-sections. The base portions may alternatively or additionally differ from each other in the width and thickness while the bottom surface of the assembled sink is even.

In applications where heat is only applied to one side of the sink and is dissipated from the other side, heat sinks described herein can be produced more cost efficiently by saving energy, and eliminating a second end portion thus reducing material costs through mass reduction from individual lamellas. This also allows a more cost effective and time saving manufacturing process by eliminating additional friction stir welding on the other side of the heat sink.

According to another embodiment of the invention, a heat sink includes a plurality of lamellas each including a base portion and a fin portion extending from a top the base portion. The lamellas are welded together in such manner that the ends of the fin portions opposite the base portion are free and not interconnected.

In some cases, lamellas without a mechanical or snap connection may be utilized. The simpler lamellas having base portions with smooth sides can reduce processing costs through the elimination of the snap feature. There is no need for a punching step prior to friction stir welding because the clamping mechanism will hold the pieces tightly together. Such an arrangement does not require the essential forces for the mechanical joining or press-fitting of the lamellas. A simpler lamella design (see FIGS. 2 and 3) without the grooves 108 and extensions 106 on the sides of the base portions 102 (as illustrated in FIG. 6) and without snap function may reduce extrusion mass, and may also improve the extrusion speed and reduce tolerance requirements. Utilizing smooth sided base portions of the lamellas can also decrease the risk of weld void formation. If individual lamellas are not fully seated during the pressing operation this could lead to air gaps or voids in the weld. The large scale heat sinks with high fin density are very difficult to manufacture as a single-piece unit. Embodiments of the invention can be used to easily produce the heat sinks with minimum fin pitch, maximum fin height, and maximum width.

A further aspect of the invention provides a method for manufacturing a heat sink from a plurality of individual lamellas each including a base portion and a fin portion extending from the base portion top, wherein the base portion is wider than the fin portion. The base portions of a plurality of lamellas are aligned such that the fin portions of each lamella extend in one direction and the base portions are forming an even surface where a component to be cooled is located. A pressing force is applied to sides of the base portions of outermost lamellas such that the sides of adjacent lamellas's base portions are urged into tight contact with one another. The base portions are welded together from the side opposite to the fin portions.

According to yet another aspect, the invention provides a lamella for use in manufacturing a one-sided high density heat sink, the lamella comprising: a base portion having a top surface, a bottom surface, and opposed side surfaces, the base portion defining a base portion cross-section; a fin portion extending from the top surface of the base portion, the fin portion having a top surface and side surfaces, the fin portion defining a fin portion cross-section, wherein the base portion cross-section is wider than the fin portion cross-section; wherein the lamella comprises a portion of an extruded metal profile, the portion of the extruded metal profile defining a length corresponding to a dimension of the heat sink.

According to yet another aspect, the invention provides a one sided heat sink for cooling an element mounted on a bottom surface of the heat sink, the heat sink comprising: a plurality of the lamellas joined together, wherein the bottom surface of the heat sink is even and formed by the bottom surfaces of the joined lamellas.

According to a further aspect, disclosed is a method of manufacturing a heat sink from a plurality of extruded lamellas, each lamella including a base portion having a top surface, a bottom surface, and two side surfaces, each lamella further including a fin portion extending from the top surface of the base portion, wherein the base portion is wider than the fin portion, the method comprising: aligning the base portions of the plurality of lamellas with the fin portion of each lamella extending in the same direction and the side surfaces of adjacent base portions facing each other; pressing the base portions of adjacent lamellas into contact with each other by applying a force to the side surface of the base portions of the outermost lamellas such that the lamellas are urged into contact with each other; and welding the bottom surfaces of adjacent base portions together.

Further aspects, objectives, and advantages, as well as the structure and function of exemplary embodiments, will become apparent from a consideration of the description, drawings, and examples. As will be understood, the invention is capable of other and different embodiments, and modifications in various respects, without departing from the invention. Accordingly, the drawings and description are for illustration purposes only and do not restrict or limit the scope of the invention.

BRIEF DESCRIPTION OF THE DRAWINGS

Objects and advantages of the present invention will be more clearly understood from the following specification when considered in conjunction with the accompanying drawings, in which:

FIGS. 6-12 illustrate embodiments of lamellas according to the invention that include groove(s) and extension(s) on the sides of the base portion;

DETAILED DESCRIPTION OF EMBODIMENTS OF THE INVENTION

Embodiments of the invention overcome problems associated with manufacturing high ratio heat sinks with long and densely situated fin portions when heat generation occurs on one side of the heat sink only. In particular, embodiments of the invention provide a cost effective and light weight solution. As such, embodiments of the invention relate to lamellas for forming a heat sink, heat sinks, and methods of manufacturing heat sinks.

Figure 1A:
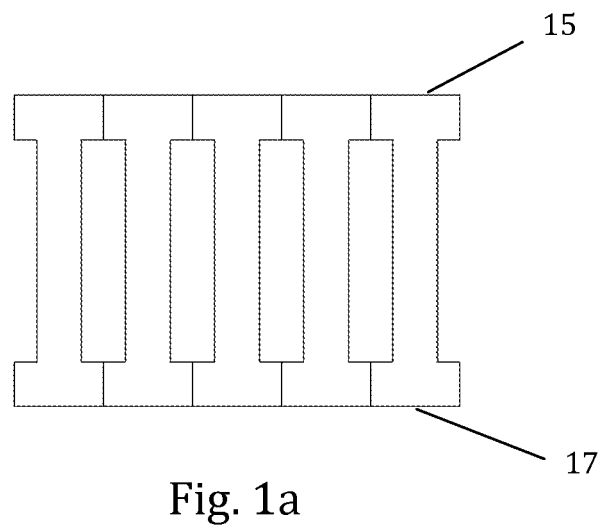
FIGS. 1a, 1b, 1c and 1d represent cross-sectional views of a known heat sink.
Figures 1B, 1C, 1D:
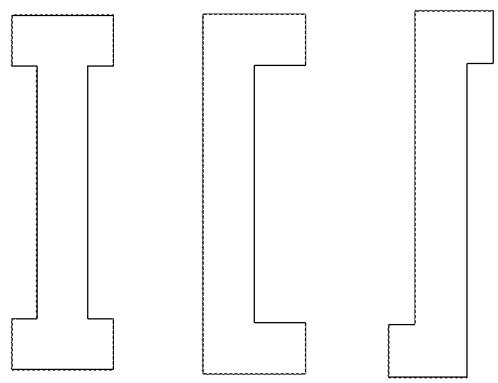
Figure 2:
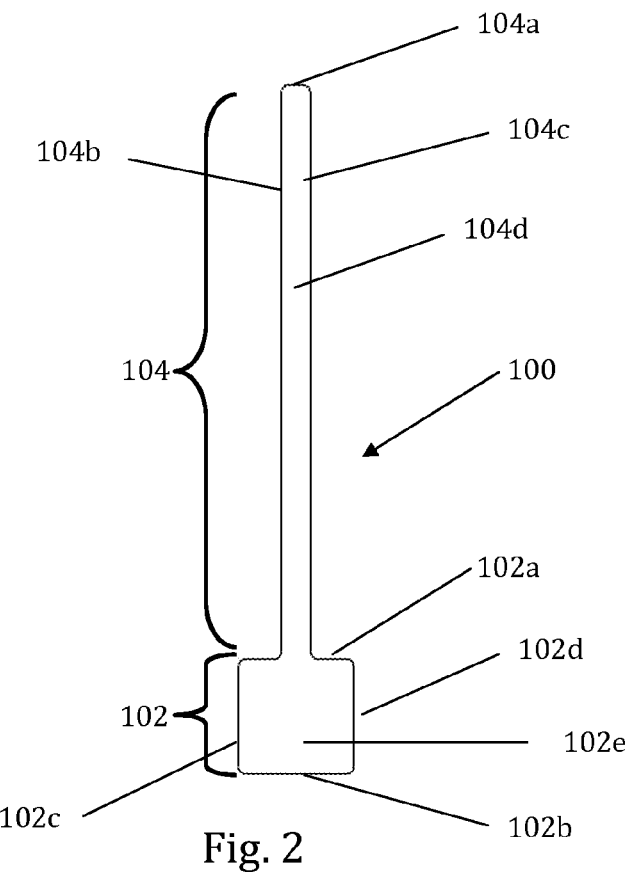
FIG. 2 represents a cross-sectional view of a first embodiment of a lamella according to the invention.
Figure 3:
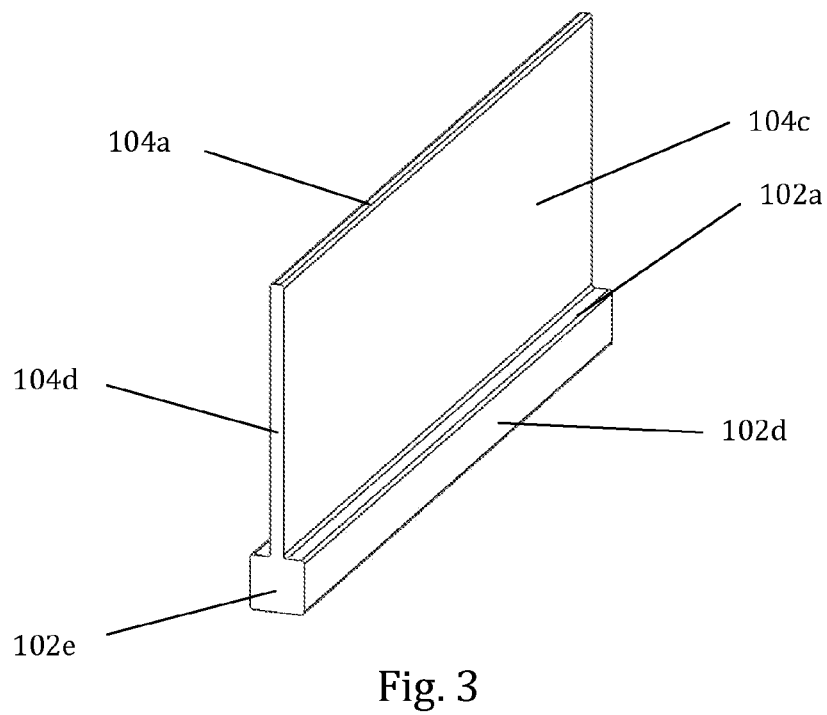
FIG. 3 represents a perspective view of the embodiment shown in FIG. 2.

Referring to FIGS. 2 and 3, a heat sink according to the invention includes a plurality of profiles or lamella 100. Each lamella 100 includes a base portion 102 and at least one fin portion 104. Each base portion includes a top surface 102a, from which the fin portion(s) extend, a bottom surface 102b, two side surfaces 102c and 102d, a front surface 102e, and a back surface opposite the front surface 102e that is not shown in FIG. 2. Each fin portion 104 has a top surface 104a, two side surfaces 104b and 104c, a front surface 104d and a back surface opposite the front surface 104d that is not shown in FIG. 2. Other configurations of the base portion 102 and fin portion 100 are also possible.

Figures 4, 5:
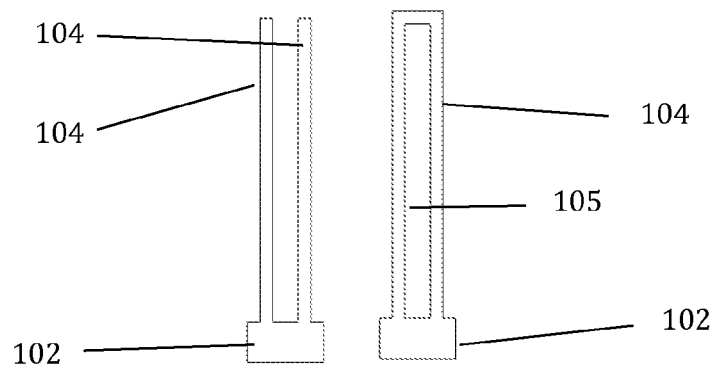
FIG. 4 represents a cross-sectional view of another embodiment of an extruded lamella according to the invention.
FIG. 5 represents a cross-sectional view of a further embodiment of a lamella according to the invention.
Figure 6:
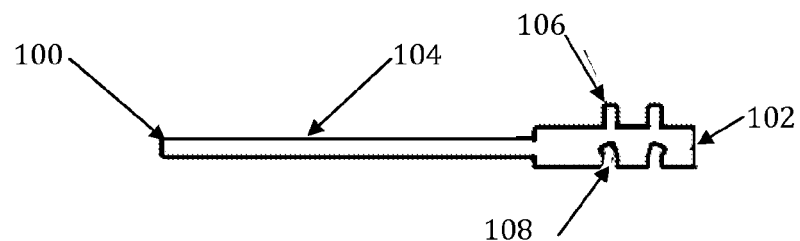
Figure 7:
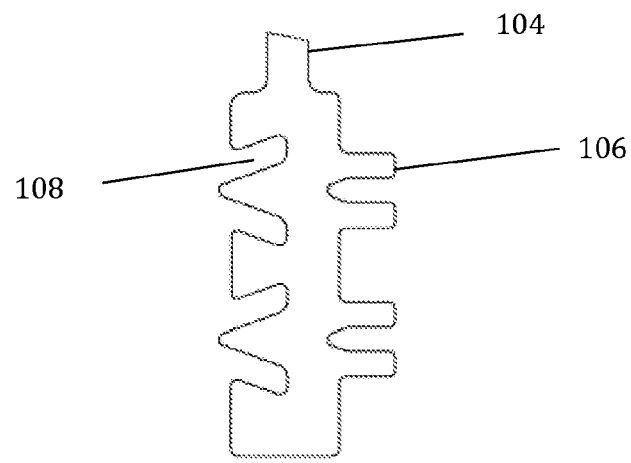

According to an embodiment, the base portion 102 is wider than the fin portion 104 in cross-section. The fin portion 104 extends from the top surface 102a of the base portion 102. The top surface 104a of the fin portion 104 opposite the base portion 102 typically is free. The fin portion(s) may extend from anywhere on the top surface 102a of the base portion 102. For example, the fin portion(s) can be centered on the base portion 102 and have two equal shoulders of the top surface 102a on either side thereof, or can extend from the base portion 102 closer to or even at an edge of the base portion 102 so as to have only one shoulder portion on the top surface 102a of the base portion. Each base portion 102 can include more than one fin portion 104 extending therefrom as illustrated in FIG. 4. Each lamella 100 is typically extruded, although other processes for forming the lamellas could be utilized and preferably from aluminum and its alloys.

Figure 24:
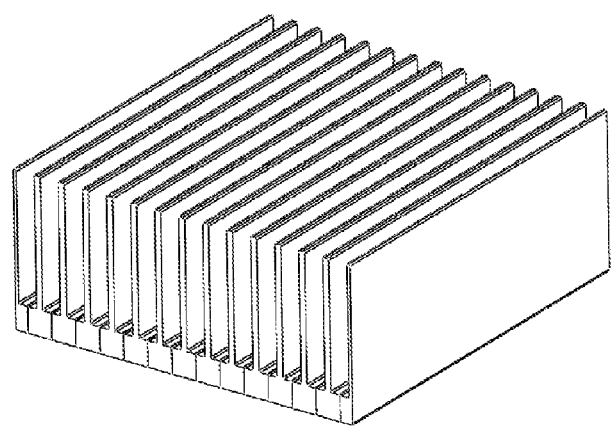
FIG. 24 illustrates an embodiment of a heat sink according to the invention.
Figure 25:
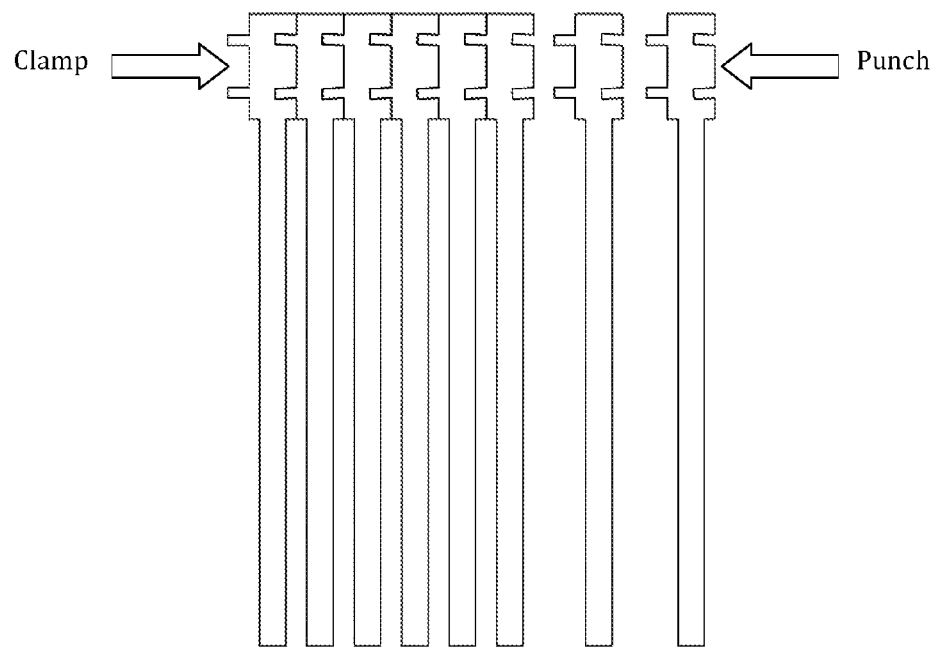
FIG. 25 illustrates another embodiment of lamellas according to the invention.

Embodiments of the invention are particularly useful for producing high aspect ratio heat sinks as illustrated in FIG. 24 while decreasing the weight of the heat sink. The assembled lamellas can have an aspect ratio (e.g., the ratio of the height of the fin portion to the distance between adjacent fin portions) ranging from a minimum of about 1:1 to a maximum of about 120:1. However, other aspect ratios are possible.

Figures 13A, 13B:
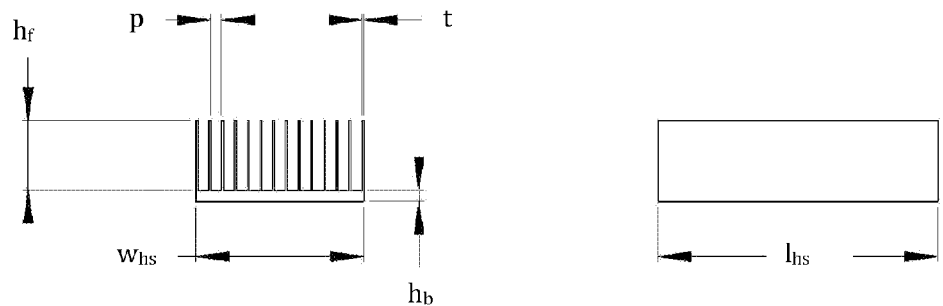
FIGS. 13a and 13b illustrate an embodiment of a heat sink according to the invention that indicates examples of dimensions of the heat sink.

Referring to FIG. 13a, the fin portions 104 typically have a thickness t of at least about 1.0 mm and a height $h_f$ ranging from a minimum of about 1.0 mm to a maximum of about 150.0 mm. For some embodiments, the height $h_f$ to thickness t ratio of the fin portions 104 may be as low as 1:1. However, for high ratio heat sinks, the height $h_f$ to thickness t ratio of the fin portions 104 may be up to about 100:1. Alternatively, the ratio between the base thickness of base portion 102 and the fin thickness t of the fin portion 104 can be as low as 1.1:1 and as high as 5:1.

The base portion 102 typically has a height $h_b$ of about 5.0 mm to about 25.0 mm. Embodiments of heat sinks may have a width $w_{hs}$ of about 76.0 mm to about 432.0 mm and a length $l_{hs}$ (see FIG. 13b) of about 101.0 mm to about 915.0 mm. Typically, fin portion 104 thickness t is minimized, fin portion p spacing is minimized and base portion thickness $h_b$ is minimized to maximize thermal performance. These dimensions are illustrated in FIGS. 13a and 13b.

At least some of the fin portions of the lamellas may be hollow, as illustrated in FIGS. 4 and 5. The entire fin portion 104 and the base portion 102 may also be hollow. Typically, hollow fin portions have a wall thickness of at least about 1.0 mm. The hollow portion 105 of the lamella may be used to direct airflow through the fin portion. FIG. 5 illustrates an embodiment of a lamella according to the invention that includes a hollow fin portion 104. A hollow fin portion or a fin portion that has three-dimensional geometries may require machining to create the desired configuration.

Figure 14:
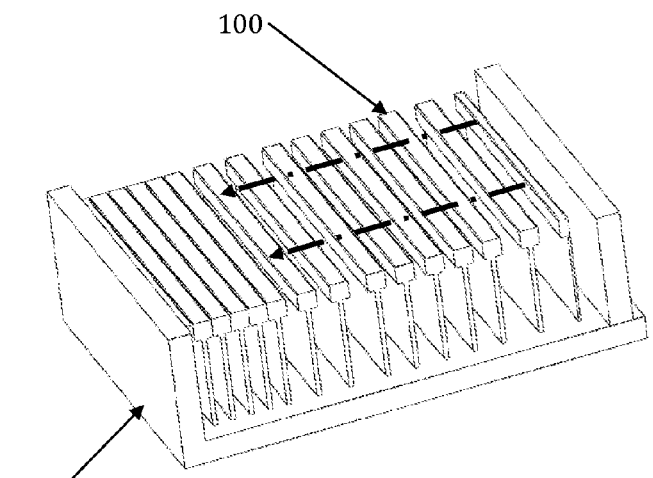
FIGS. 14-19 illustrate a method according to the invention including arranging lamellas in a stack in a joining tool and joining the lamellas together.
Figure 15:
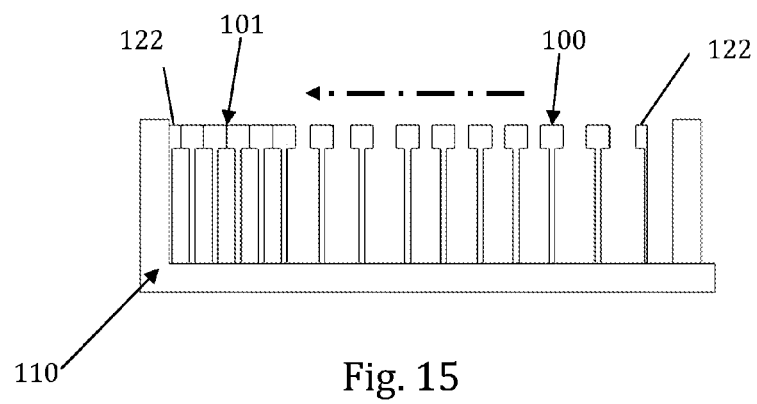

The base portions 102 of the lamellas may include extensions 106 and/or grooves 108 that can facilitate joining the base portions 102 of two neighboring lamellas to each other, for example, by a press-fit or snap connection. Additionally or alternatively, extensions 106 and/or grooves 108 can help to align the base portions 102 of the lamellas by providing a mechanical connection or joint among the lamellas along the base portions prior to joining them in another way, such as by welding and/or another technique. Examples of such embodiments are shown in FIGS. 6-12 and 25. Each base portion 102 may include at least one extension 106 on one side 102c and at least one groove 108 on an opposite side 102d. The grooves 108 and extensions 106 may be arranged such that the extension(s) on one lamella 100 base portion 102 fit into the groove(s) 108 on an adjacent base portion 102 of the adjacent lamella 100. Grooves 108 and extensions 106, such as those shown in FIG. 25, may fit together with a press-fit. Grooves 108 and extensions 106, such as those shown in FIG. 7, may fit together with a snap-fit, whereby it is necessary to apply a certain amount of pressure for the extensions to be inserted into the grooves. The pressure may be applied in any suitable manner. As shown in FIG. 14, the press/snap fit may be accomplished utilizing a mechanical clamp 110 or punch press to apply pressure to the stack of lamellas 100.

The base portion 102 of each lamella 100 can each include one or more grooves 108 and extensions 106. FIGS. 8 and 12 illustrate an embodiment that includes four extensions and four grooves interconnected into the heat sink. According to this embodiment, a region between each groove can define an extension that is to be received by a groove between two extensions of the neighboring lamella.

According to an embodiment, the extension(s) and/or the groove(s) may have a curvature to further facilitate joining of the lamellas to each other. Such extensions 106 and grooves 108 can provide a snap function that could provide sufficient strength to hold the lamellas 100 together to form the heat sink. The embodiments shown in FIGS. 6-12 illustrate the snap or press-fit connection of lamellas in one unit or heat sink. This kind of connection requires higher forces to be applied from the sides to the lamellas 100 stacked into the package compared to the embodiment of FIG. 25, which requires only the alignment of the base portions 102 of the lamellas 100 without their proper interconnection. For performing a press-fit or snap connection, forces applied to the tool 110 can range from about 15 to about 120 kilonewtons. The geometry and amount of the extensions and the corresponding grooves may vary and may provide for a reliable connection that might not necessarily require the following joining operations. However, as described below, friction stir welding typically is still utilized. Even without any curvature, embodiments of the extensions and grooves can provide a press-fit connection between lamellas.

Figure 23:
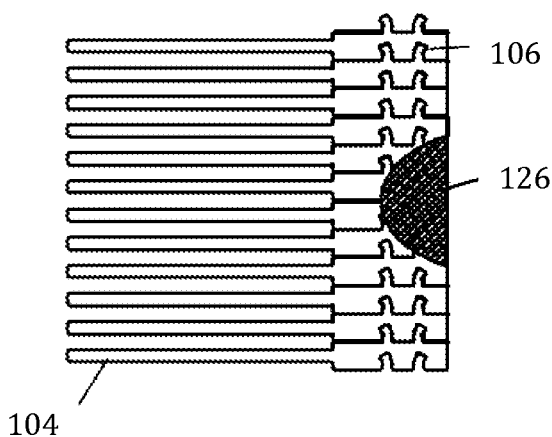
FIG. 23 illustrates an embodiment of heat sink made of extruded lamellas including grooves and extensions on the sides of base portions and welded together.

If the lamellas 100 are connected by a press-fit or snap-fit, the lamellas may or may not also be welded together. In embodiments where the lamellas are welded together, wherein the welded direction is not along the neighboring lamellas, the weld may extend sufficiently deep to at least partially weld the grooves and extensions together (weld area 126), as shown in FIG. 23. In other words, the weld area 126 may extend through the base portion 102 toward the fin portions 104 into the regions of the grooves 108 and extensions 106. The weld seam 126 may extend in depth to any point through the grooves 108 and extensions 106 and in some embodiments may extend entirely through the grooves 108 and extensions 106. The use of friction stir welding in addition to the grooves 106 and extensions 108 can provide additional strength to the interconnection. Welding the grooves 106 and extensions 108 can also help to ensure that there is no air gap between the lamellas 100 resulting in better thermal efficiency. In embodiments where the welded seam is angled to the longitudinal direction of the base portions 102, the mechanical joints can improve thermal performance of the heat sinks by helping to ensure good contact between the lamellas 100 in non-weld areas. The mechanical joints can also improve reliability of the welding process and reduce the cost of the heat sink.

The lamellas 100 may be formed by extrusion or another suitable technique, preferably from aluminum and/or aluminum alloys. After extrusion, the lamellas are cut into multiple lamellar segments having a size corresponding to a desired heat sink dimension. Subsequent to the cutting, the lamellas 100 are joined together to form the heat sink.

According to an embodiment, forming the heat sink includes arranging the lamellas 100 adjacent to each other along their base portions 102, e.g., alongside portions 102c and 102d. Any number of lamellas may be arranged with the base portions 102 adjacent each other and the fin portions 104 extending in the same direction, preferably parallel to each other. According to an embodiment, there are no other restrictions on the length, number, or geometry of the lamellas. Each individual lamella may be manufactured and then cut into pieces of the appropriate dimensions, such as length. The extruded lamella may have two base portions 102 at each end of the lamella and then be cut in the middle to form two lamellas each with one base portion 102 and one fin portion 104. The dimensions typically are defined by the heat dissipating requirements for the heat sink. When a one-sided heat sink is formed, the component to be cooled is mounted onto the base portion of the sink, on the surface 102b opposite to the top 102a of the base portion 102 that includes the fin portions 104.

The lamellas 100 are typically arranged such that a side contact surface 102c of one base potion 102 butts up against the side contact surface 102d of the base portion 102 of the adjacent lamella 100. If the lamellas 100 include extensions 106 and grooves 108 made on these side surfaces 102c, 102d, the extensions may be fitted in the grooves freely or with press-fit as the lamellas are stacked together. To facilitate the alignment and/or joining of the lamellas 100, they may be arranged in a tool such as a fixture, clamp or jig 110 as shown in FIGS. 14-17. As shown in FIGS. 14-20, the two outermost lamellas 122 in the stack of lamellas 100 may have a base portion 102 that is narrower than the other lamellas 100 in the stack. Additionally or alternatively, the fin portion 104 on the two outer lamellas 122 can extend from the base portion 102 at the side surface 102c or 102d such that this side surface of the base portion 102 is even with and continued by the surface 104b or 104c of the respective fin 104.

Figure 16:
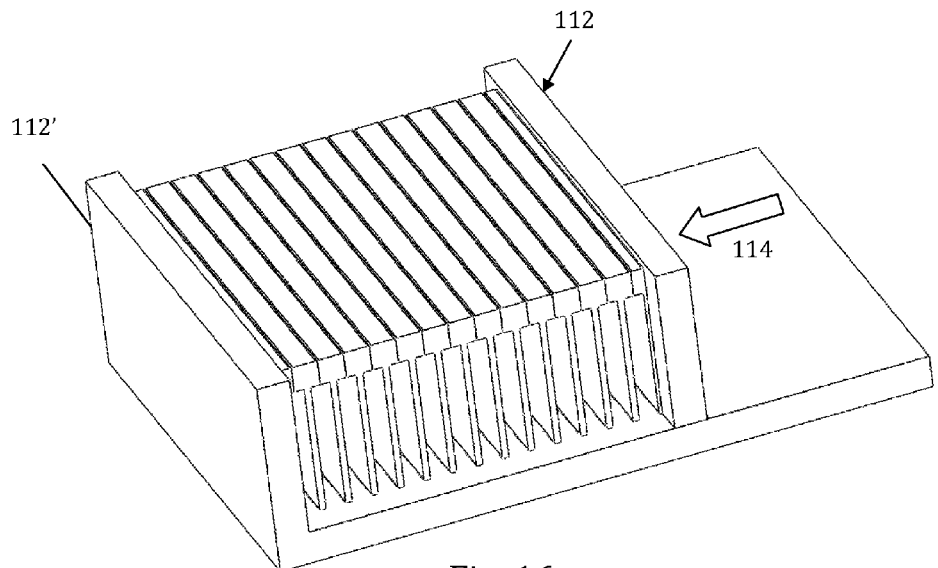
Figure 17:
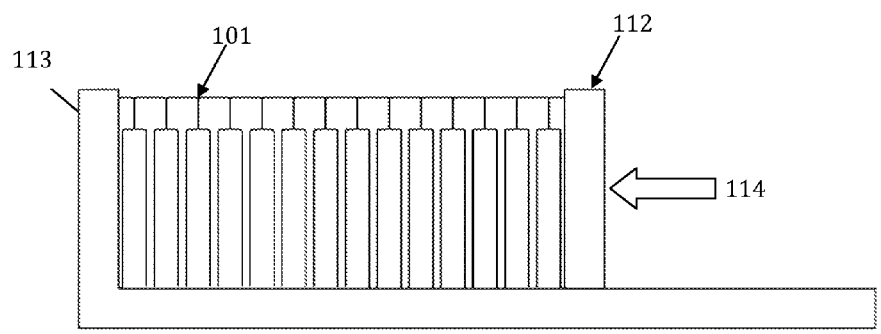

After forming the stack or the package of the extruded lamellas 100 also referred to as the individual lamellas 100, the lamellas 100 may be urged together as shown in FIGS. 14-17. A force may be applied to one or both of the outer lamellas 122 in the stack of lamellas to urge the lamellas 100 together as indicated by the arrows in FIGS. 14 and 15. The lamellas 100 may be tightly pressed together. If the lamellas 100 are arranged in the clamp 110, the sides of the clamp may be urged or pressed together from either one or both sides, the contact surfaces 102c and 102d of adjacent base portions 102 of the lamellas 100 are pressed tightly together with a clamping force indicated by an arrow 114 shown in FIG. 17 creating a contact line 101 between the adjacent lamellas 100. The clamping force may be from about 0.2 to about 6.2 kilonewtons. As shown in FIG. 16, only one clamp block 112 may be movable to compress the stack or package of the lamellas 100 into contact and the opposite end 112' of the fixture, clamp or jig 110 may be stationary.

Figure 20:
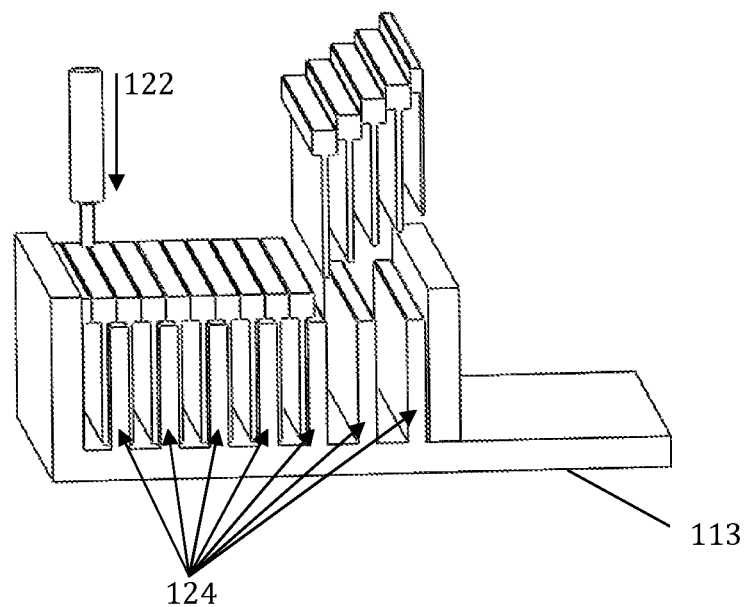
FIG. 20 illustrates an aspect of another method that includes arranging supports between fin portions of the lamellas during stacking and joining of the lamellas.

Additionally, in embodiments of the invention, when the individual lamellas 100 are arranged in the clamp 110, it is not necessary for the free end 104a of the fin portions 104 and/or the top surface 102a of the base portions 102 between the fin portions 104 to be supported by and/or in contact with the clamping tool structure as illustrated in FIG. 20. Thus, the lamella stack or package may be pressed between the opposite elements 112, 112' of the tool so that the free ends of fin portions 104a do not reach the base part 113 of the tool 110. The base part 113 of the tool 110 can be oriented horizontally or vertically. As shown in FIG. 20, in some cases during welding it may be necessary to use a plurality of supports 124 as part of the fixture in order to counteract the resultant forces caused by the FSW process in the—Z direction illustrated by arrow 122. The plasticized material in the weld zone around the pin tends to displace from the weld zone under the process loads, which in turn might lead to formation of internal or surface breaking defects in the joint. This may be circumvented by confining softened material in the weld zone with aid of a backing bar or support 124. These supports can be inserted in between fin portions 104 until they touch the base portion 102 top surfaces 102a as shown in FIG. 20. The supports 124 can be made of steel or any non-contaminating material that can counteract the force of the welding tool 116.

After the lamellas 100 are aligned adjacent to one another to form the heat sink, they may be joined together by a friction stir welding tool 116 having a rotating shoulder 116b and a rotating pin 116a. This can be done by penetrating the base portions 102 of the lamellas 100 in at least one location at a junction of adjacent lamellas on the surface 102b of the base portions 102 opposite the fin portions 104 by bringing the rotating pin 116a and the rotating shoulder 116b into contact with this surface (shoulder 116 does not penetrate surface 102b). Utilizing friction stir welding on the base portion bottom surface 102b, which is opposite to the top surface 102a provided with the fin portions 104, can generate excellent joints with high thermal conductivity. The joints or the welded seams 118 produced by FSW may also be void-free and leak-proof. The heat source or an electronic component mounting area of the heat sink may be fully welded to minimize thermal resistance or partly welded to minimize the costs. Other welding or joining techniques may also be employed.

Usually, adjacently aligned workpieces are welded together along a contact line 101 (see FIG. 15) by any welding method, thereby forming a weld seam that joins the parts together. When joining individual lamellas 100 into a heat sink unit as described herein, instead of using larger segments or units as known in the prior art, it may not be desirable to weld the individual parts together along the contact line 101 because it can be a costly and time consuming procedure due to the high amount of such contact lines. Therefore, according to embodiments of the heat sinks described herein, which are manufactured from the individual lamellas 100, the lamellas are typically not welded along the contact lines 101 or joints between the adjacent base portions 102 of the lamellas 100 in the longitudinal direction. Rather, the heat sink can be welded across and/or angled to the contact lines 101 between the adjacent base portions 102.

Figure 18:
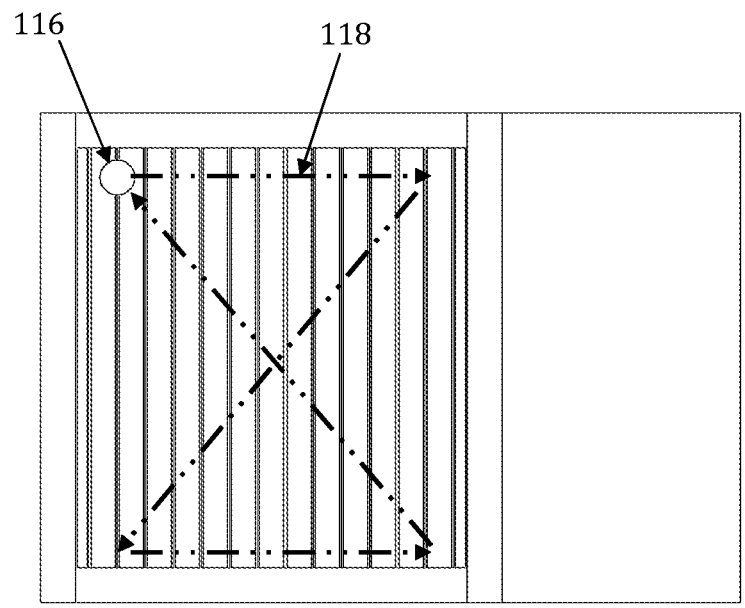
Figure 19:
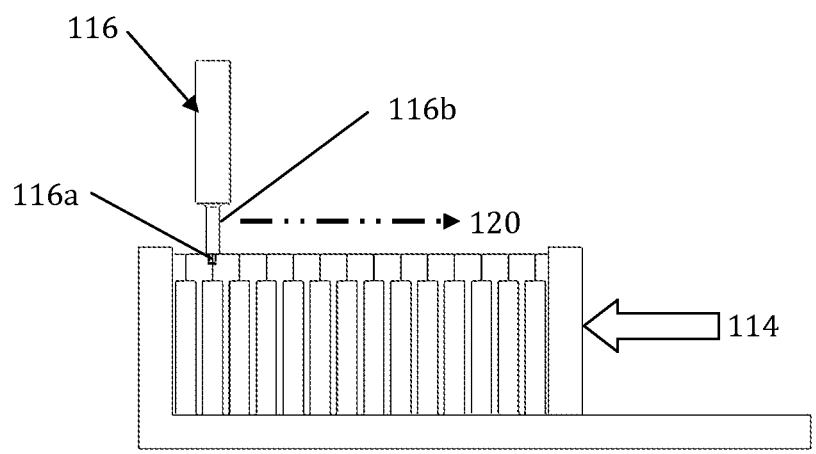

For example, as shown in FIGS. 18, 19, 21, and 22, the friction stir welding may be carried out along a path forming a weld seam 118. The welding can also be carried out at discrete points along the path at each joint contact line 101 between the adjacent base portions 102 of the lamellas 100. The base portion 102 of one lamella 100 can be welded at least at one point to each adjacent lamella 100. The tool 116 may be moved vertically in order to penetrate by its pin 116a the base portions 102. The tool 116 can also be moved linearly with the shoulder 116 in contact with surface 102b in a direction 120 across the contact joint lines 101 as shown in FIG. 19 forming the weld seam 118. Different patterns of the weld seams 118 may be utilized in carrying out the friction stir welding depending on the requirement of the heat sink. FIG. 18 illustrates one example of the seam pattern 118 seen on the bottom surface 102b of the base portions 102 due to the friction stir welding. According to an embodiment, the friction stir welding is carried out to form the weld seam 118 across all the lamellas 100 joining them into a heat sink unit. The width and the depth of the weld seam 118 can vary depending on strength and thermal requirements as well as the welding tool 116 utilized.

Figure 21:
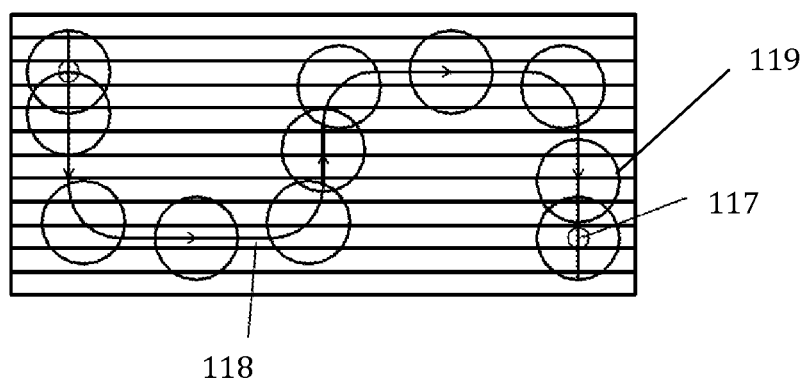
FIGS. 21 and 22 illustrate alternative welding patterns according to the invention.
Figure 22:
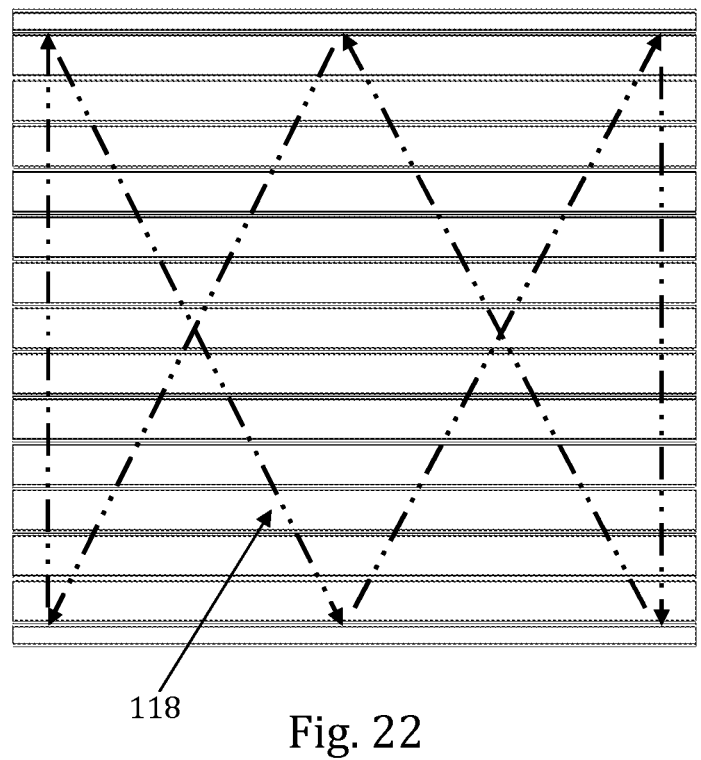

The smaller circle 117 in FIG. 21 illustrates movement of a rotating FSW tool pin 116a. The larger circles 119 illustrate the tool shoulder 116b of the FSW tool contacting bottom surface 102b on the base portions 102 of the stack of lamellas 100. The shoulder 116b contacting the surface 102b is larger in diameter than the rotating pin 116a and generates frictional heat when contacting the surface 102b to plasticize the metal, thus, forming the seam 118 or the pattern visible on the bottom surface 102b of the base portions 102. The bottom surface of the heat sink, which is formed from the bottom surfaces 102b of the joined lamellas 100 may be machined after welding to reduce any unevenness in seam 118. FIG. 24 illustrates an embodiment of a heat sink unit assembled according to the invention.

Figure 26:
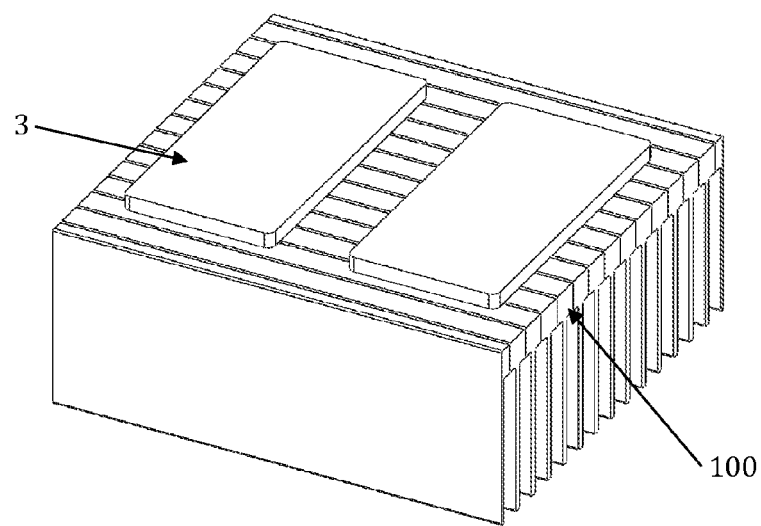
FIG. 26 illustrates an embodiment of a heat sink with heat-generating components attached.

After the lamellas 100 are joined together by any method and possibly machined on the bottom surface 102b, one or more heat sources 3, structures or one or more electronic components 3 to be cooled may be attached to the heat sink bottom surface 102b, as illustrated in FIG. 26. Known techniques may be utilized to join the electronic components to the heat sink, the most common method being mechanical fastening.

Figure 27:
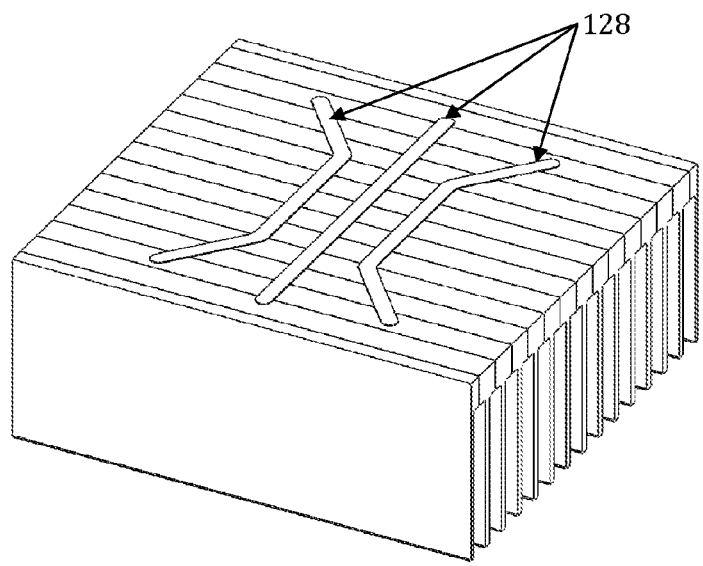
FIGS. 27 and 28 illustrate embodiments of a heat sink including embedded heat pipes.
Figure 28:
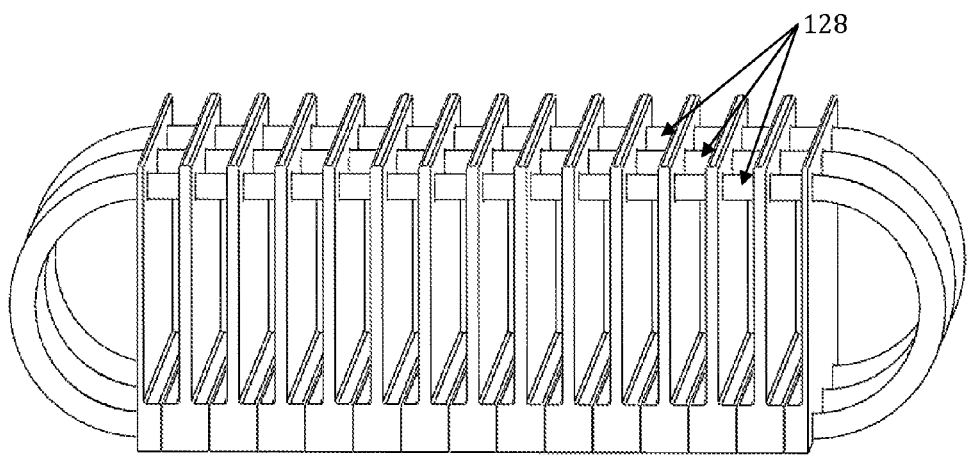

According to another embodiment, the heat sink may include heat pipes 128, as shown in FIGS. 27 and 28. Heat pipes are tubular devices of various cross sectional shape made of metal, typically aluminum or copper, that are fully sealed and contain a liquid under pressure. When heat is applied to the heat pipes 128, the liquid quickly boils and vaporizes and travels to the other end of the heat pipe where it condenses under cooler conditions and returns by capillary action. The heat pipes 128 can be embedded into the base portion 102 to evenly spread the heat across the extents of the base of the heat sink as shown in FIG. 27. Alternatively, the heat pipes 128 can connect the base 102 to the fins 104, extracting heat from the base of the heat sink to the fins more quickly as shown in FIG. 28. Both methods can improve overall performance of the heat sink.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as described.

We claim:

1. A method of manufacturing a heat sink from a plurality of extruded lamellas, each lamella including a base portion having a top surface, a bottom surface, and two side surfaces, each lamella further including a fin portion extending from the top surface of the base portion, wherein the base portion is wider than the fin portion, the method comprising:

aligning the base portions of the plurality of lamellas with the fin portion of each lamella extending in the same direction and the side surfaces of adjacent base portions facing each other;

pressing the base portions of adjacent lamellas into contact with each other by applying a force to the side surface of at least one of the base portions; and welding the bottom surfaces of adjacent base portions together, wherein each base portion comprises an extension on one of the side surfaces and a groove on the other of the side surfaces, wherein the groove is configured to receive the extension of an adjacent lamella, the method further comprising: joining the base portions together by inserting the extensions in the adjacent grooves prior to welding, said method further comprising press fitting the extensions into the grooves prior to welding, or snap fitting the extensions into the grooves prior to welding.

2. The method according to claim 1, wherein the welding comprises friction stir welding applied to the bottom surfaces of the base portions in a direction that passes at least once over the bottom surface of each base portion.

3. The method according to claim 1, further comprising:
machining a weld seam on the bottom surface defined by the base portions of the lamellas after the lamellas are welded to each other to form the heat sink.

4. The method according to claim 1, wherein the adjacent grooves and extensions are welded together through their entire depth.

5. The method according to claim 1, further comprising:
extruding the lamellas from a metal, wherein the lamellas have a height to thickness ratio of between about 1.1:1 and about 5:1.

* * * * *